(12) United States Patent
Howard et al.

(10) Patent No.: US 6,885,147 B2
(45) Date of Patent: Apr. 26, 2005

(54) ORGANIC LIGHT EMITTING DIODE DEVICES WITH IMPROVED ANODE STABILITY

(75) Inventors: Webster E. Howard, Lagrangeville, NY (US); Gary W. Jones, Lagrangeville, NY (US); Richard A. Campos, Cortlandt Manor, NY (US); Chen-Jean Chou, New City, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 09/919,467

(22) Filed: Jul. 31, 2001

(65) Prior Publication Data

US 2002/0021088 A1 Feb. 21, 2002

Related U.S. Application Data

(60) Provisional application No. 60/085,911, filed on May 18, 1998, and provisional application No. 60/085,910, filed on May 18, 1998.

(51) Int. Cl.[7] .......................... H01J 1/62; H05B 33/14
(52) U.S. Cl. ...................................... 313/504; 313/506
(58) Field of Search ............................... 313/504, 506, 313/505, 498; 315/169.3; 428/690, 917; 257/40

(56) References Cited

U.S. PATENT DOCUMENTS

| | | | | | |
|---|---|---|---|---|---|
| 4,769,292 | A | * | 9/1988 | Tang et al. | 428/690 |
| 5,399,936 | A | * | 3/1995 | Namiki et al. | 313/504 |
| 5,552,678 | A | * | 9/1996 | Tang et al. | 315/169.3 |
| 5,776,622 | A | * | 7/1998 | Hung et al. | 428/690 |
| 5,920,080 | A | * | 7/1999 | Jones | 257/40 |
| 6,069,442 | A | * | 5/2000 | Hung et al. | 313/504 |
| 6,133,581 | A | * | 10/2000 | Terao et al. | 257/40 |
| 6,337,492 | B1 | * | 1/2002 | Jones et al. | 257/40 |
| 6,501,217 | B1 | * | 12/2002 | Beierlein et al. | 313/504 |
| 6,657,224 | B1 | * | 12/2003 | Shi et al. | 257/40 |

\* cited by examiner

*Primary Examiner*—Nimeshkumar D. Patel
*Assistant Examiner*—Karabi Guharay
(74) *Attorney, Agent, or Firm*—Epstein Drangel Bazerman & James, LLP; Joseph F. Murphy

(57) ABSTRACT

The present invention relates to OLED devices having anodes with improved stability and longer lifetime. In particular, the present invention relates to OLEDs comprising an anode having improved stability and longer lifetime wherein the anode comprises a semi-transparent single layer comprising molybdenum.

3 Claims, 11 Drawing Sheets

ORGANIC LIGHT EMITTING DIODE DEVICES WITH IMPROVED ANODE STABILITY

CROSS-REFERENCE TO RELATED APPLICATIONS

This application claims priority on U.S. Provisional Application Ser. No. 60/085,911 filed May 18, 1998, on U.S. Provisional Application Ser. No. 60/085,910, filed May 18, 1998, on U.S. Utility patent application Ser. No. 09/313,285 filed May 18, 1999 and on U.S. Utility patent application Ser. No. 09/700,173 filed Nov. 13, 2000. +gi

STATEMENT REGARDING FEDERALLY SPONSORED RESEARCH OR DEVELOPMENT

This work was sponsored by the U.S. Air Force under Air Force Contract #F41624-97-C-6026.

BACKGROUND OF THE INVENTION

Organic electroluminescent devices, also known as organic light emitting diode ("OLED") devices, comprise an anode, a cathode and an electroluminescent medium made up of extremely thin layers (typically less than 1.0 micrometer in combined thickness) separating the anode and the cathode. A basic two-layer light emitting diode comprises one organic layer that is specifically chosen to inject and transport holes and a second organic layer that is specifically chosen to inject and transport electrons. The interface between the two layers provides an efficient site for the recombination of the injected hole-electron pair, which results in electroluminescence. The electroluminescent medium can comprise additional layers, including, but not limited to, an emitter layer between the hole injection and transport and the electron injection and transport layers in which recombination of holes and electrons occurs. Since light emission is directly related to current density through the organic electroluminescent medium, the thin layers coupled with increased charge injection and transport efficiencies have allowed acceptable light emission levels (e.g., brightness levels capable of being visually detected in ambient light) to be achieved with low applied voltages in ranges compatible with integrated circuit drivers, such as field effect transistors.

One factor that may affect the commercial applications of OLEDs is the useful life span of the device. In particular, OLED luminance and life span are sometimes adversely impacted by efforts to improve device efficiency, such as, for example, by plasma treatment of the transparent or semi-transparent conducting anode. Thus, gains in efficiency as a result of plasma treatment may result in reduced luminance and life span of the OLED. The reduction of initial luminance appears to relate to work function instabilities in the anode resulting from some efficiency-promoting processes. Accordingly, the luminance of many OLEDs (particularly those subjected to plasma treatment) degrades too rapidly with time to permit the OLEDs to be acceptable for commercial purposes. Therefore, there is a significant need for OLEDs with improved anode stability in terms of anode work function. OLEDs with improved anode stability are likely to produce luminance that falls off less rapidly with operation time, thereby increasing the useful life span of the OLEDs.

BRIEF SUMMARY OF THE INVENTION

In a first embodiment, the present invention relates to an organic light emitting diode device comprising: (a) a cathode; (b) an anode comprising: (i) a first layer; and (ii) a semi-transparent second layer that is a stabilizing layer, wherein the area of the stabilizing layer is substantially equal to the area of the first layer; and (c) at least two organic layers between the anode and the cathode, wherein the at least two organic layers comprise a first organic layer formed from at least one electron-injection/electron-transport material and a second organic layer formed from at least one hole-injection/hole-transport material, wherein the electron-injection/electron-transport material is adjacent to the cathode and the hole-injection/hole-transport material is adjacent to the anode.

In a second embodiment, the present invention relates to an organic light-emitting diode device that emits green light, comprising: (a) a bottom electrode that is an anode comprising a first layer comprising indium tin oxide and a second layer that is a stabilizing layer comprising molybdenum, wherein the area of the stabilizing layer is substantially equal to the area of the first layer; (b) a hole-injection layer adjacent to the stabilizing layer comprising copper phthalocyanine (CuPc); (c) a hole-transport layer adjacent to the hole-injection layer comprising N,N'-bis(1-naphthyl)-N,N'-diphenyl-1,1'-biphenyl-4,4'-diamine (NPD); (d) an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof; (e) an electron-transport layer adjacent to the emitter layer comprising ALQ; and (f) a top electrode that is a cathode comprising lithium fluoride and aluminum, or magnesium and silver.

In a third embodiment, the present invention relates to an organic light-emitting diode device that emits white or blue light, comprising: (a) a bottom electrode that is an anode comprising a first layer comprising indium tin oxide and a second layer that is a stabilizing layer comprising molybdenum, wherein the area of the stabilizing layer is substantially equal to the area of the first layer; (b) a hole-injection layer adjacent to the stabilizing layer comprising CuPc; (c) a hole-transport layer adjacent to the hole-injection layer comprising NPD; (d) an emitter layer adjacent to the hole-transport layer comprising DCJTB, IDE-120 and IDE-102; (e) an electron-transport layer adjacent to the emitter layer comprising ALQ; and (e) a top electrode that is a cathode comprising aluminum and lithium fluoride.

In a fourth embodiment, the present invention relates to a microdisplay device comprising: (a) a cathode; (b) an anode comprising: (i) a first layer; and (ii) a semi-transparent second layer that is a stabilizing layer, wherein the area of the stabilizing layer is substantially equal to the area of the first layer; and (c) at least two organic layers between the anode and the cathode, wherein the at least two organic layers comprise a first organic layer formed from at least one electron-injection/electron-transport material and a second organic layer formed from at least one hole-injection/hole-transport material, wherein the electron-injection/electron-transport material is adjacent to the cathode and the hole-injection/hole-transport material is adjacent to the anode.

In a fifth embodiment, the present invention relates to an organic light-emitting diode device that emits green light, comprising: (a) a bottom electrode that is an anode comprising molybdenum; (b) a hole-injection layer adjacent to the anode comprising CuPc; (c) a hole-transport layer adjacent to the hole-injection layer comprising NPD; (d) an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof; (e) an electron-transport layer adjacent to the emitter layer comprising ALQ; and (f) a top electrode that is a cathode comprising lithium fluoride and aluminum, or magnesium and silver.

In a sixth embodiment, the present invention relates to an organic light-emitting diode device that emits white or blue light, comprising: (a) a bottom electrode that is an anode comprising molybdenum; (b) a hole-injection layer adjacent to the anode comprising CuPc; (c) a hole-transport layer adjacent to the hole-injection layer comprising NPD; (d) an emitter layer adjacent to the hole-transport layer comprising DCJTB, IDE-120 and IDE-102; (e) an electron-transport layer adjacent to the emitter layer comprising ALQ; and (f) a top electrode that is a cathode comprising aluminum and lithium fluoride.

In a seventh embodiment, the present invention relates to a microdisplay device comprising: (a) a cathode; (b) an anode comprising a single layer; and (c) at least two organic layers between the anode and the cathode, wherein the at least two organic layers comprise a first organic layer formed from at least one electron-injection/electron-transport material and a second organic layer formed from at least one hole-injection/hole-transport material, wherein the electron-injection/electron-transport material is adjacent to said cathode and the hole-injection/hole-transport material is adjacent to said anode.

In an eighth embodiment, the present invention relates to an organic light-emitting diode device that emits green light, comprising: (a) a bottom electrode that is an anode comprising a compound selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals; (b) a hole-injection layer adjacent to the anode comprising CuPc; (c) a hole-transport layer adjacent to the hole-injection layer comprising NPD; (d) an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof; (e) an electron-transport layer adjacent to the emitter layer comprising ALQ; and (f) a top electrode that is a cathode comprising lithium fluoride and aluminum, or magnesium and silver.

In a ninth embodiment, the present invention relates to an organic light-emitting diode device that emits white or blue light, comprising: (a) a bottom electrode that is an anode comprising a compound selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals; (b) a hole-injection layer adjacent to the anode comprising CuPc; (c) a hole-transport layer adjacent to the hole-injection layer comprising NPD; (d) an emitter layer adjacent to the hole-transport layer comprising DCJTB, IDE-120 and IDE-102; (e) an electron-transport layer adjacent to the emitter layer comprising ALQ; and (f) a top electrode that is a cathode comprising aluminum and lithium fluoride.

In a tenth embodiment, the present invention relates to a microdisplay device comprising: (a) a cathode; (b) an anode comprising a single layer comprising molybdenum; and (c) at least two organic layers between the anode and the cathode, wherein the at least two organic layers comprise a first organic layer formed from at least one electron-injection/electron-transport material and a second organic layer formed from at least one hole-injection/hole-transport material, wherein the electron-injection/electron-transport material is adjacent to the cathode and the hole-injection/hole-transport material is adjacent to the anode.

DETAILED DESCRIPTION OF THE INVENTION

The present invention relates to OLEDs comprising an anode having improved stability and longer lifetime. In particular, the present invention relates to OLEDs comprising an anode having improved stability and longer lifetime wherein the anode comprises a semi-transparent stabilizing layer comprising molybdenum.

OLEDs can be fabricated by any method known to those skilled in the art. In one embodiment, OLEDs are formed by vapor deposition of each layer. In a preferred embodiment, OLEDs are formed by thermal vacuum vapor deposition.

"Bottom electrode," as used herein, means an electrode that is deposited directly onto a substrate.

"Top electrode," as used herein, means an electrode that is deposited at the end of the OLED that is distal to the substrate.

"Hole-injection layer," as used herein, is a layer into which holes are injected from an anode when a voltage is applied across an OLED.

"Hole-transport layer," as used herein, is a layer having high hole mobility and high affinity for holes that is between the anode and the emitter layer. It will be evident to those of skill in the art that the hole-injection layer and the hole-transport layer can be a single layer, or they can be distinct layers comprising different chemical compounds.

"Electron-injection layer," as used herein, is a layer into which electrons are injected from a cathode when a voltage is applied across an OLED.

"Electron-transport layer," as used herein, is a layer having high electron mobility and high affinity for electrons that is between the cathode and the emitter layer. It will be evident to those of skill in the art that the electron-injection layer and the electron-transport layer can be a single layer, or they can be distinct layers comprising different chemical compounds.

"Down-emitting," as used herein, refers to an OLED in which light is transmitted through the transparent or semi-transparent bottom electrode, which is typically an anode.

"Up-emitting," as used herein, refers to an OLED in which light is transmitted through the transparent or semi-transparent top electrode, which is typically a cathode.

Figure 1:
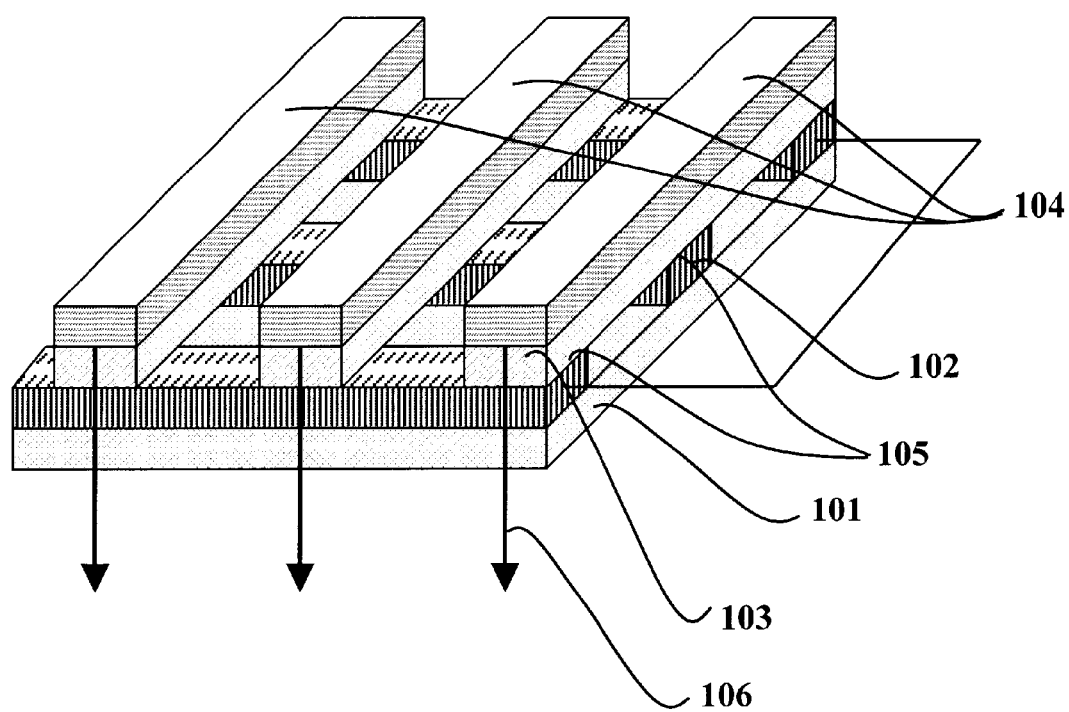
FIG. 1 shows an array of down-emitting OLED devices according to the prior art.

FIG. 1 shows a simplified design for a down-emitting OLED known in the art. The OLED comprises a transparent or semi-transparent substrate 101 on which a plurality of transparent or semi-transparent electrodes, which are anodes 102, are formed. Substantially perpendicular to and overlaying the plurality of anodes 102 are columns of electroluminescent medium 103, which comprises at least two layers. The materials comprising the layers of the electroluminescent medium 103 are chosen such that the OLED emits light of a desired wavelength. Top electrodes 104, which are cathodes, are layered on the electroluminescent medium 103.

Pixels 105 are formed at the intersection of the anodes 102 and the columns of electroluminescent medium 103 and top electrodes 104. Light 106 is generated in the electroluminescent medium 103 at a particular pixel when the appropriate voltage is applied to the anode 102 and cathode 104 of the pixel. The light 106 is emitted downward through the substrate 101 when the cathodes 104 comprise a reflective coating and the anodes 102 and substrate 101 are transparent or semi-transparent.

Figure 2:
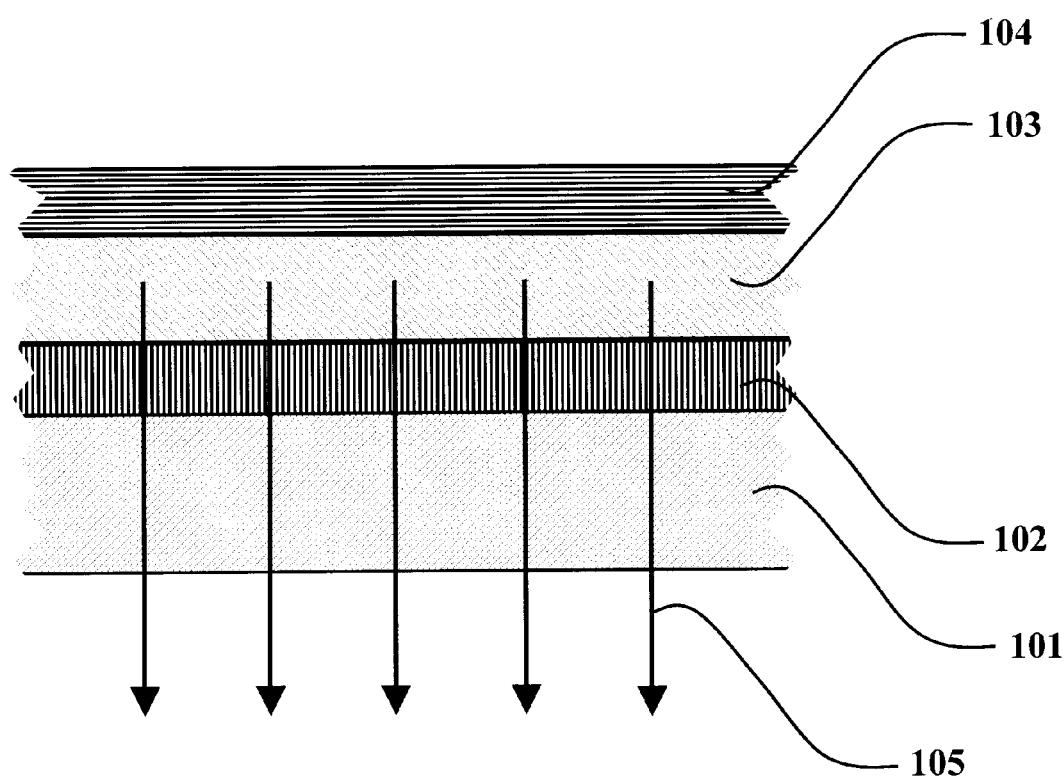
FIG. 2 shows a single down-emitting OLED device according to the prior art.

FIG. 2 shows a down-emitting OLED known in the art. The OLED device includes a glass substrate 101. A transparent hole-injection anode or electrode 102 of indium tin oxide ("ITO") is formed on the substrate 101. An electroluminescent medium (organic stack) 103 is formed on the anode 102, which forms the bottom layer of the stack. A metal cathode 104 is located on top of the electroluminescent medium 103. In the device, light 105 is emitted downward through the anode 102 and the glass substrate 101. Thus, an OLED requires two electrodes, an anode 102 and a cathode 104, at least one of which must be transparent or semi-transparent in order for light to escape the device. The anode 102, which must supply holes to the emitter region of the organic stack, is typically formed from a material having a high work function, since this will lead to a low energy barrier for hole injection. The cathode 104, which must supply electrons to the emitter region of the organic stack, is usually formed from a material having a low work function, which will facilitate electron injection.

Indium tin oxide, which is a good transparent conductor and has a high work function (approximately 5.0 eV), has been used as an anode material. It has been observed that the injection efficiency of indium tin oxide, and consequently the luminescent efficiency of the OLED, may be enhanced by pre-treating the material with an oxygen plasma. Without being bound by any theory, pre-treatment of an anode with oxygen plasma may provide excess of oxygen at the interface of the anode 102 and the organic stack 103, and may contribute to the instability of an OLED due to oxygen migration into the organic stack. Indium tin oxide has also been used together with thin metal inter-layers to form cathode contacts, where the thin metal inter-layers provide electron injection.

Figure 3:
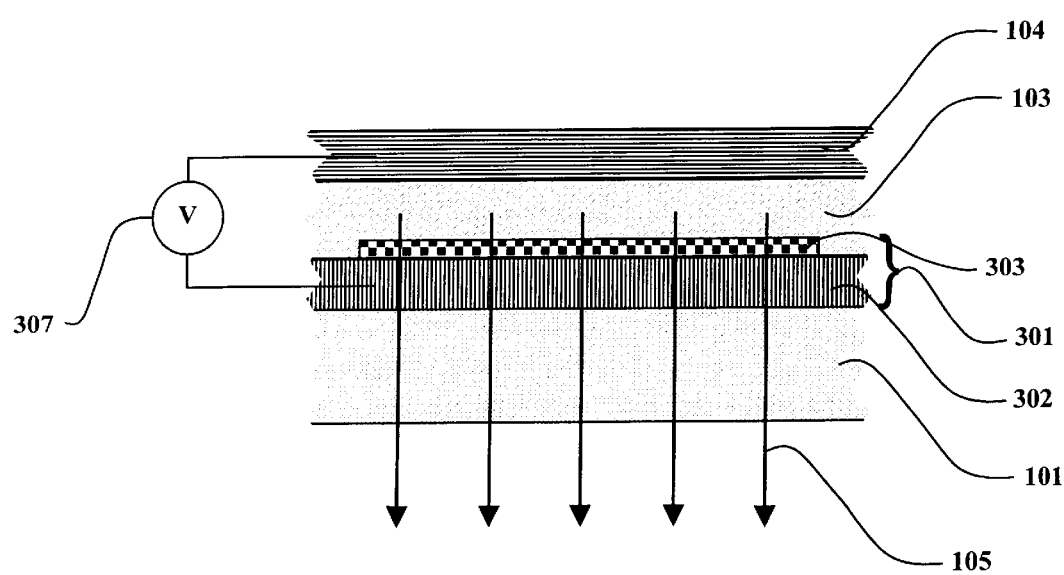
FIG. 3 shows one embodiment of an OLED device of the present invention having an anode with improved stability.

FIG. 3 shows one embodiment of an OLED device of the present invention having an anode with improved stability. One OLED pixel is pictured. The device comprises a transparent or semi-transparent substrate 101 with a multi-layer anode 301 formed thereon. In addition to a first anode layer 302, the anode 301 further comprises a second layer 303 that improves the stability of the anode, which is referred to herein as a "stabilizing layer." Layered on top of the stabilizing layer 303 is the electroluminescent medium 103, which comprises at least two layers. The OLED further comprises a cathode 104 adjacent to the electroluminescent medium 103. When a voltage 307 is applied across the anode 102 and the cathode 104 of the device, light 105 is emitted from the electroluminescent medium 103 and is transmitted through the anode 301 and the substrate 101.

The first anode layer 302, which may be deposited on the substrate using known technologies, is typically between 300 Å and 1500 Å thick and comprises a metal having a high work function, a metal oxide and mixtures thereof. Preferably, the first anode layer comprises a material selected from the group consisting of a conducting or semiconducting metal oxide such as indium zinc tin oxide, indium zinc oxide, ruthenium dioxide, or indium tin oxide, a metal having a high work function, such as gold or platinum, and a mixture of a metal oxide and a metal having a high work function.

The stabilizing layer 303 is deposited on top of the first anode layer 302. In one embodiment, the stabilizing layer comprises a material selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals. In another embodiment, the stabilizing layer comprises a material selected from the group consisting of molybdenum oxide or molybdenum nitride. In a preferred embodiment, the stabilizing layer is preferably semi-transparent and comprises molybdenum or an alloy thereof. Most preferably, the stabilizing layer comprises molybdenum. The stabilizing layer is between 10 Å and 200 Å thick, preferably less than about 100 Å thick.

Figure 4:
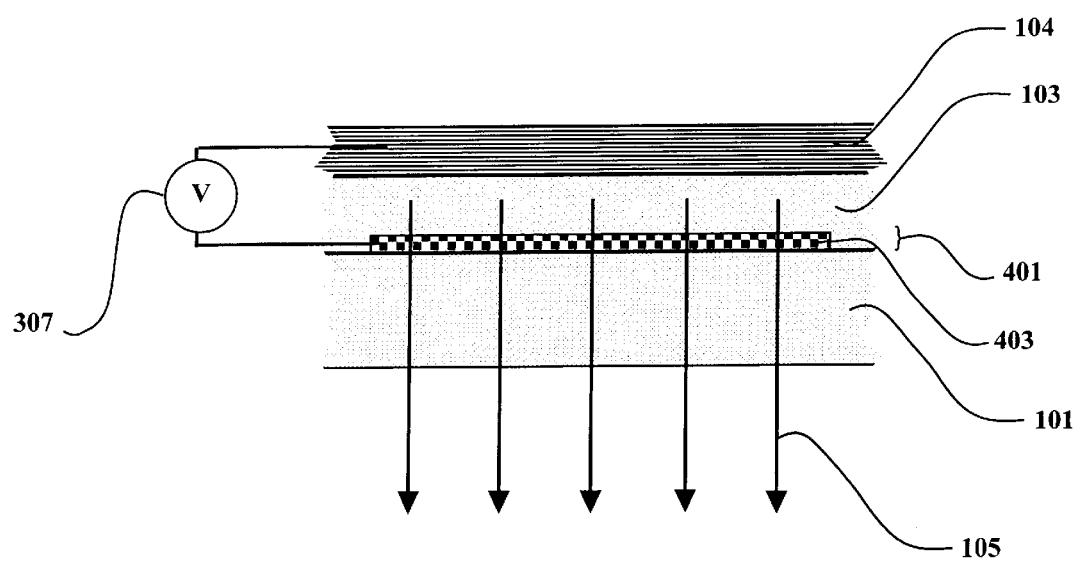
FIG. 4 shows another embodiment of an OLED device of the present invention having an anode with improved stability.

FIG. 4 shows a preferred embodiment of an OLED of the present invention having an anode with improved stability. In this embodiment, the anode 401 comprises a single layer 403 deposited on the substrate 101. The first anode layer 302 shown in FIG. 3 is not present in this embodiment. Layered on top of the anode 401 is the electroluminescent medium 103, which comprises at least two layers. The OLED further comprises a cathode 104 adjacent to the electroluminescent medium 103. When a voltage 307 is applied across the anode 401 and the cathode 104 of the device, light is emitted from the electroluminescent medium 103 and is transmitted through the anode 401 and the substrate 101.

In a preferred embodiment of the present invention, an anode 401 having improved stability comprises a single layer 403. In one embodiment, the single layer comprises a material selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals. In another embodiment, the single layer comprises a material selected from the group consisting of molybdenum oxide or molybdenum nitride. Preferably, the single layer is semi-transparent and comprises molybdenum or an alloy thereof. Most preferably, the single layer comprises molybdenum. The single layer is between 10 Å and 200 Å thick, preferably less than about 100 Å thick.

Figure 5:
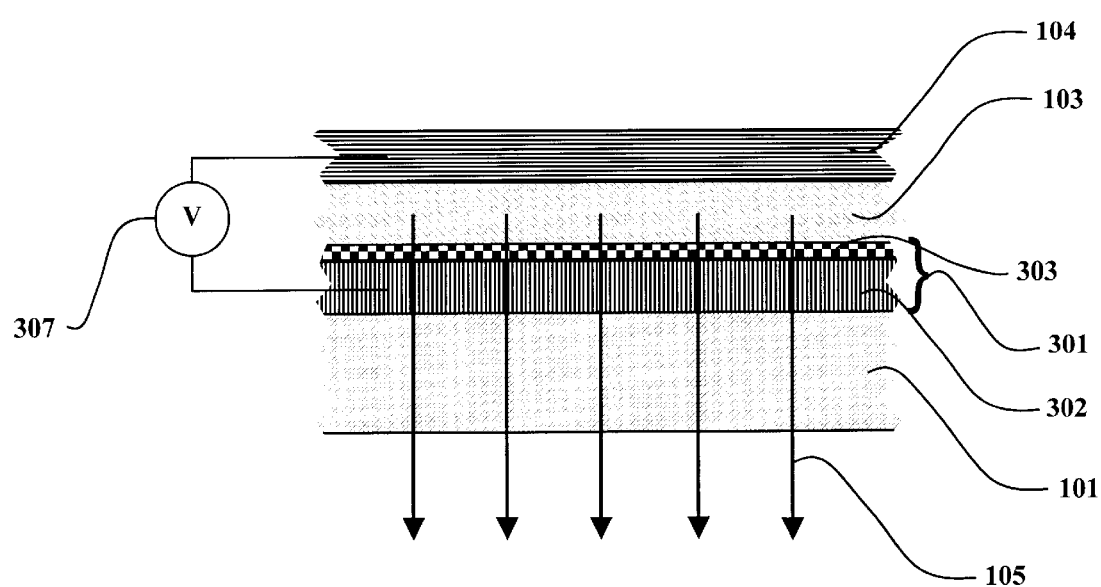
FIG. 5 shows another embodiment of an OLED device of the present invention having an anode with improved stability.

FIG. 5 shows another preferred embodiment of a OLED of the present invention having an anode with improved stability. In this embodiment, the anode 301 is multi-layered and comprises a first anode layer 302 and a second layer that is a stabilizing layer 303. In this embodiment, the stabilizing layer 303 is co-extensive with the first anode layer 302, i.e., the area of the stabilizing layer 303 is substantially equal to the area of the first anode layer 302 on which it is deposited and completely covers the first anode layer 302. All other layers in this embodiment are as described for the embodiment shown in FIG. 3.

Figure 6:
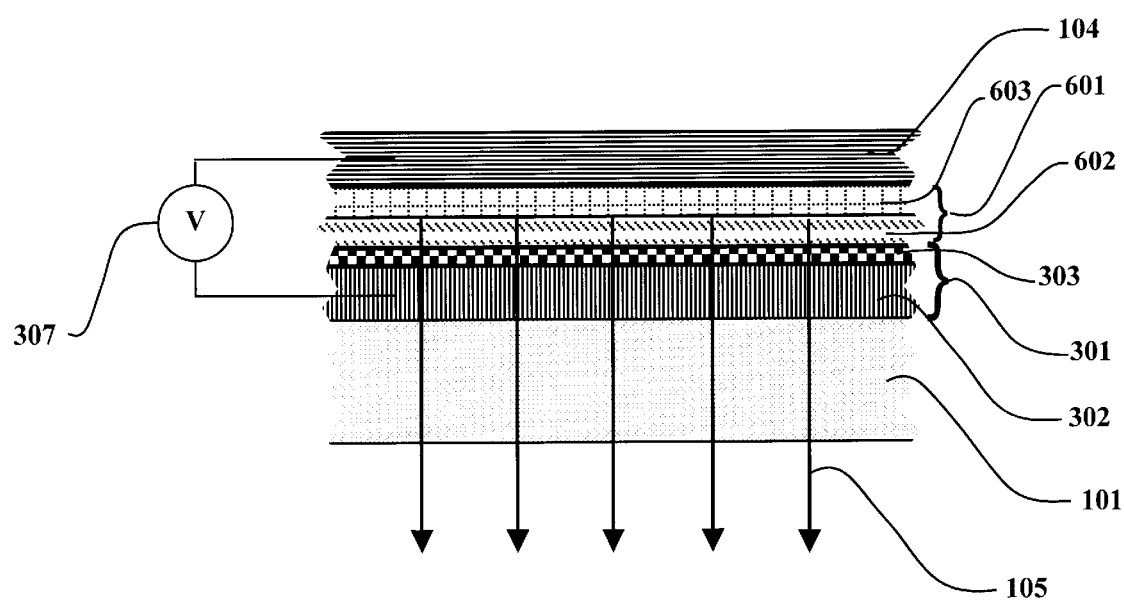
FIG. 6 shows still another embodiment of an OLED device of the present invention where the electroluminescent layer comprises a hole-injection/hole-transport layer and an electron-injection/electron-transport layer.

Another embodiment is shown in FIG. 6. In this embodiment, the electroluminescent layer 601 between the multi-layer anode 301 and the cathode 104 comprises a hole-injection/hole-transport layer 602 adjacent to the second layer 303 of the anode 301 and an electron-injection/electron-transport layer 603 adjacent to the cathode 104.

Figure 7:
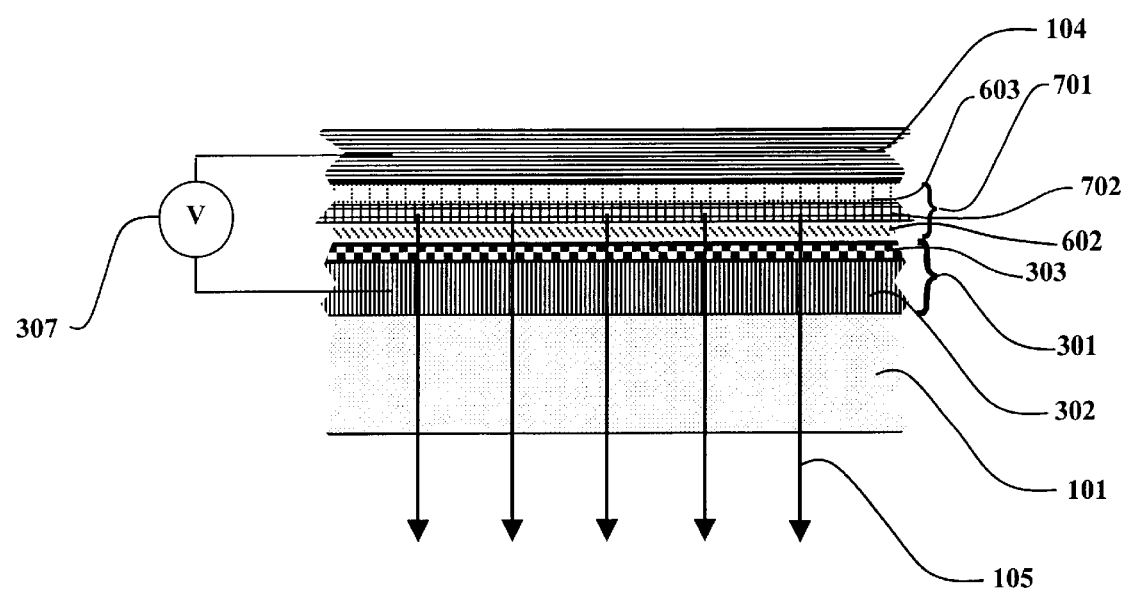
FIG. 7 shows another embodiment of an OLED device of the present invention where the electroluminescent layer comprises an emitter layer between the hole-injection/hole-transport layer and the electron-injection/electron-transport layer.

In yet another embodiment shown in FIG. 7, the electroluminescent layer 701 further comprises between the hole-injection/hole-transport layer 602 and the electron-injection/electron-transport layer 603 an emitter layer 702 in which holes and electrons recombine to produce light.

Where the anode is deposited on the substrate, the stabilizing layer may be deposited using a vacuum deposition process, such as an electron beam or plasma sputtering process. A multi-layered anode in an OLED of the present invention may be patterned using a photoresist mask that is formed on the stabilizing layer of the anode and a process such as wet etching or lift-off techniques to remove the unmasked material. In one embodiment, the stabilizing layer may be ashed before additional layers are deposited on the anode.

Figure 8:
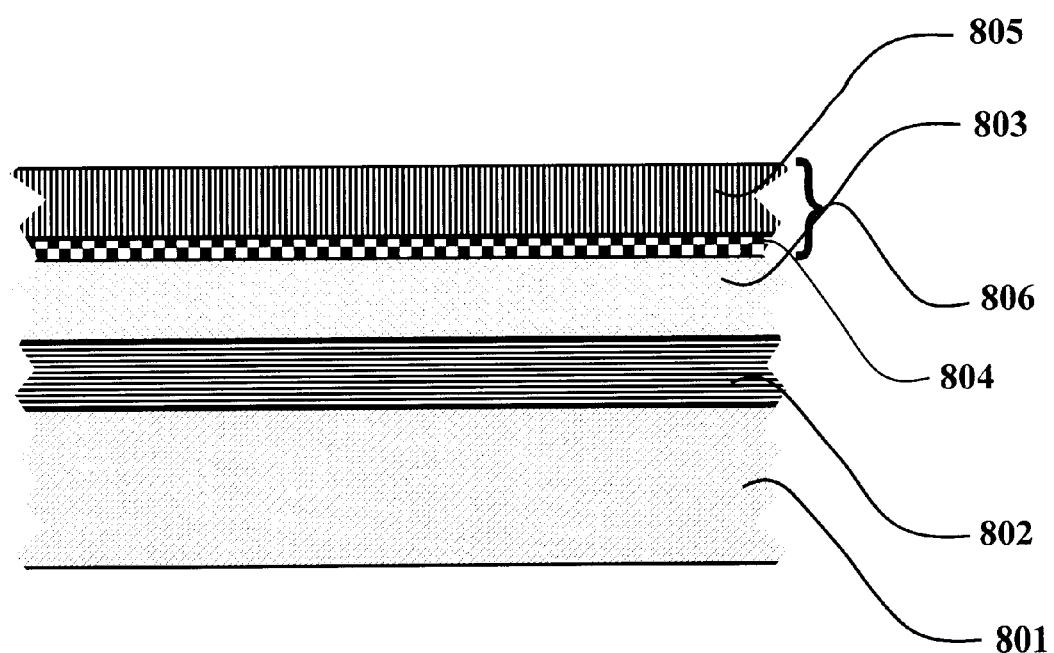
FIG. 8 shows another embodiment of the present invention where the top electrode is an anode.

FIG. 8 shows another embodiment of the present invention. In this embodiment, the cathode 802 is formed on the substrate 801. An organic stack 803 is formed on the cathode 802. A stabilizing layer 804 is formed on the organic stack 803. A first anode layer 805 is formed on the stabilizing layer 804. Together, the stabilizing layer 804 and the first anode layer 805 comprise the anode 806. The first anode layer may comprise a compound including but not limited to indium tin oxide and indium zinc oxide. Without being bound by any theory, the stabilizing layer 804 improves OLED stability by isolating the first anode layer 805 from the organic stack 803 and reducing oxygen migration from the first anode layer 805 into the organic stack 803. In one embodiment, the stabilizing layer 804 is sufficiently thin (less than about 100 Å) such that the anode 806 is transparent or semi-transparent and light is emitted upward. In another embodiment, the cathode 802 is transparent or semi-transparent and light is emitted downward.

Figure 9:
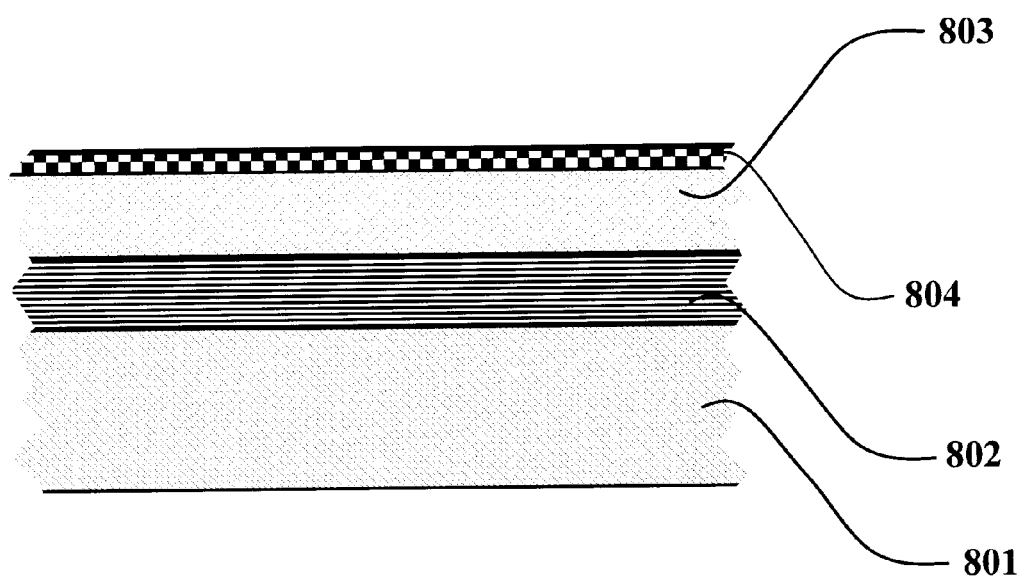
FIG. 9 shows another embodiment of the present invention where the top electrode is an anode comprising a stabilizing layer.

FIG. 9 shows another embodiment of the present invention. In this embodiment, the cathode 802 is formed on the substrate 801. An organic stack 803 is formed on the cathode 802. An anode 804 is formed on the organic stack 803. In this embodiment, the first anode layer shown in FIG. 8 is absent. In one embodiment, the stabilizing layer 804 is sufficiently thin (less than about 100 Å) such that the anode is transparent or semi-transparent and light is emitted upward. In another embodiment, the cathode 802 is transparent or semi-transparent and light is emitted downward.

Those of skill in the art will readily appreciate that the OLED may be configured to be up-emitting, with a transparent or semi-transparent top electrode, which is typically a cathode, or down-emitting, with a transparent or semi-transparent bottom electrode.

The OLED may comprise a hole-injection layer adjacent to the anode and at least two hole-transport layers, a first hole-transport layer adjacent to the hole-injection layer and a second hole-transport layer adjacent to the first hole-transport layer. The hole-injection layer and the at least two hole-transport layers may be deposited separately. Alternately, at least two of the layers may be inter-deposited.

In other embodiments, the OLED comprises an electron-injection layer and at least one electron-transport layer.

In yet another embodiment, the electroluminescent medium comprises a hole-injection/hole-transport layer adjacent to the anode, an electron-injection/electron-transport layer adjacent to the cathode, and an emitter layer between the hole-injection/hole-transport layer and the electron-injection/electron-transport layer.

In yet another embodiment, the OLED can further comprise an additional layer adjacent to the top electrode. In a preferred embodiment, the layer comprises indium tin oxide.

Other OLED structures will be evident to those skilled in the art.

A transparent or semi-transparent substrate upon which down-emitting OLEDs may be formed can comprise any material known to those of skill in the art, including, but not limited to, glass, quartz, sapphire and plastic. An opaque substrate upon which up-emitting OLEDs may be formed can comprise any material known to those of skill in the art, including, but not limited to, silicon, plastic, and ceramics such as alumina. Preferably, an opaque substrate upon which up-emitting OLEDs may be formed comprises silicon; most preferably, the substrate comprises silicon in which is embedded drive circuitry for the OLED devices thereon.

Addition of a stabilizing layer described herein to an anode provides distinct advantages over other techniques for increasing anode stability. First, the materials of the stabilizing layer form highly conductive, mechanically strong, and morphologically smooth films on the first layer. Second, these materials are relatively inexpensive, commonly available, and readily processed using standard techniques and mask types. Third, an electrically conductive oxide may form spontaneously on the surface of the stabilizing layer when it is exposed to air, which may provide an improved junction with the organic materials in adjacent layers.

A semi-transparent cathode is typically between 70 and 150 Å thick. In one embodiment, the cathode comprises a single layer of one or more metals, at least one of which has a low work function. Such metals include, but are not limited to, lithium, aluminum, magnesium, calcium, samarium, cesium and mixtures thereof. Preferably, the low work function metal is mixed with a binder metal, such as silver or indium. In another embodiment, the cathode further comprises a layer of dielectric material adjacent to the electron-injection/electron-transport layer, the dielectric material including, but not limited to, lithium fluoride, cesium fluoride, lithium chloride and cesium chloride. Preferably, the dielectric material is lithium fluoride or cesium fluoride. In yet another embodiment, the cathode comprises a first cathode layer comprising an electron-transport material and a second thin layer comprising a low work function material adjacent to the electron-injection/electron-transport layer of the electroluminescent medium. In preferred embodiments, the cathode comprises either aluminum and lithium fluoride, a mixture of magnesium and silver, a mixture of lithium and aluminum, or calcium followed by aluminum. In yet another embodiment, the cathode comprises magnesium, silver and lithium fluoride.

In one embodiment, the hole-injection/hole-transport layer is about 750 Å thick. Hole-injection/hole-transport layers typically comprise at least one material with good hole mobility. Examples of such materials include, but are not limited to, CuPc, and aromatic amine compounds such as NPD, bis(N,N'-1-naphthyl-phenyl-amino-biphenyl)-biphenyl amine (BPA-DNPB) and bis(carbazol-N-biphenyl)-biphenyl amine (BPA-BCA).

The OLED may comprise an emitter layer between the electron-injection/electron-transport layer and the hole-injection/hole-transport layer in which electrons from the electron-injection/electron-transport layer and holes from the hole-injection/hole-transport layer recombine. Depending on the composition of the emitter layer, OLEDs emit visible light of different colors. Emitter layers typically comprise at least one host compound, either alone or together with at least one dopant compound. Examples of host compounds include, but are not limited to, 2,2',7,7'-naphthyl-9,9'-spirobifluorene (N-SBF), ALQ and IDE-120 (Idemitsu Kosan Co., Ltd., Tokyo, Japan). Examples of dopant compounds include, but are not limited to, Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, quinacridone derivatives such as diethyl pentyl quinacridone and dimethyl quinacridone, distyrylamine derivatives, such as IDE-102 (Idemitsu Kosan Co., Ltd., Tokyo, Japan), rubrene, DCJTB, pyrromethane 546, and mixtures thereof. The structure of DCJTB is shown below:

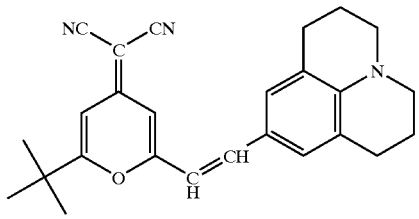

An emitter layer may be between 200–400 Å thick.

The electron-injection/electron-transport layer is typically about 350 Å thick and comprises a compound such as ALQ, or a suitable oxadiazole derivative. In a preferred embodiment, the electron-injection/electron-transport layer is ALQ.

In one embodiment, an OLED of the present invention is a down-emitter that emits green light and comprises an anode comprising indium tin oxide in the first layer, a stabilizing layer of molybdenum oxide, a hole-injection layer adjacent to the stabilizing layer comprising CuPc, a hole-transport layer adjacent to the hole-injection layer comprising NPD, an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride and aluminum, or magnesium and silver.

In another embodiment, an OLED of the present invention is an up-emitter that emits green light and comprises an anode comprising indium tin oxide in the first layer and molybdenum in the stabilizing layer, a hole-injection layer adjacent to the anode comprising CuPc, a hole-transport layer adjacent to the hole-injection layer comprising NPD, an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride, magnesium and silver.

In yet another embodiment, an OLED of the present invention emits white or blue light and comprises an anode comprising indium tin oxide in the first layer and molybdenum in the stabilizing layer, a hole-injection layer adjacent to the stabilizing layer comprising CuPc, a hole-transport layer adjacent to the hole-injection layer comprising NPD, an emitter layer adjacent to the hole-transport layer comprising DCJTB, IDE-102 and IDE-120, an electron-transport layer adjacent to the emitter layer comprising ALQ, and a cathode comprising lithium fluoride and aluminum.

In one preferred embodiment, an OLED of the present invention is a down-emitter that emits green light and comprises an anode comprising a single layer of molybdenum, a hole-injection layer adjacent to the anode comprising CuPc, a hole-transport layer adjacent to the hole-injection layer comprising NPD, an emitter layer adjacent to the hole-injection layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride and aluminum, or magnesium and silver.

In another preferred embodiment, an OLED of the present invention is an up-emitter that emits green light and comprises an anode comprising a single layer comprising molybdenum, a hole-injection layer adjacent to the anode comprising CuPc, a hole-transport layer adjacent to the hole-injection layer comprising NPD, an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride, magnesium and silver.

In yet another preferred embodiment, an OLED of the present invention emits white or blue light and comprises an anode comprising a single layer comprising molybdenum, a hole-injection layer adjacent to the anode comprising CuPc, a hole-transport layer adjacent to the hole-injection layer comprising NPD, an emitter layer adjacent to the hole-transport layer comprising DCJTB, IDE-102 and IDE-120, an electron-transport layer adjacent to the emitter layer comprising ALQ, and a cathode comprising lithium fluoride and aluminum.

In still another embodiment, an OLED of the present invention is a down-emitter that emits green light and comprises an anode comprising a single layer comprising a compound selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals, a hole-injection layer adjacent to the anode comprising CuPc, a hole-transport layer adjacent to the hole-injection layer comprising NPD, an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride and aluminum, or magnesium and silver.

In yet another embodiment, an OLED of the present invention is an up-emitter that emits green light and comprises an anode comprising a single layer comprising a compound selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals, a hole-injection layer adjacent to the anode comprising CuPc, a hole-transport layer adjacent to the hole-injection layer comprising NPD, an emitter layer adjacent to the hole-transport layer comprising ALQ and a compound selected from the group consisting of Coumarin 6, Coumarin 485, Coumarin, 487, Coumarin 490, Coumarin 498, Coumarin 500, Coumarin 503, Coumarin 504, Coumarin 504T, Coumarin 510, Coumarin 515, Coumarin 519, Coumarin 521, Coumarin 521T, Coumarin 522B, Coumarin 523, Coumarin 525, Coumarin 535, Coumarin 540A, Coumarin 545, Coumarin 545T, and mixtures thereof, an electron-transport layer adjacent to the emitter layer comprising ALQ, and a cathode comprising lithium fluoride, magnesium and silver.

In yet another embodiment, an OLED of the present invention emits white or blue light and comprises an anode comprising a single layer comprising a compound selected from the group consisting of niobium (Nb), zirconium (Zr), cobalt (Co), zinc (Zn), technetium (Tc), hafnium (Hf), tantalum (Ta), chromium (Cr), gold (Au), platinum (Pt), palladium (Pd), selenium (Se), nickel (Ni), tungsten (W), alloys of one or more of these metals, oxides of one or more of these metals and nitrides of one or more of these metals, a hole-injection layer adjacent to the anode comprising CuPc, a hole-transport layer adjacent to the hole-injection layer comprising NPD, an emitter layer adjacent to the hole-transport layer comprising DCJTB, IDE-102 and IDE-120, an electron-transport layer adjacent to the emitter layer comprising ALQ, and a cathode comprising lithium fluoride and aluminum.

In a preferred embodiment, an array of OLEDs of the present invention comprise a microdisplay. A microdisplay is a display device that is not viewable by the unaided eye, and therefore requires the use of an optic. A microdisplay may be monochromatic, that is, each pixel comprising the display emits light of the same color. Alternatively, various pixels of a microdisplay may emit different colors. A full-color microdisplay is formed from an array of pixels comprising a red, a green and a blue sub-pixel. The sub-pixels in any particular pixel can be activated in various combinations to generate an entire spectrum of colors. Preferably, the sub-pixel size of a microdisplay device is less than about 15 microns, more preferably less than about 5 microns, and most preferably between about 2 microns and about 3 microns.

The multi-layered OLED embodiments of the invention allow for a "staircase" change in the energy difference of electrons and holes as they travel from the electrodes through each layer toward the emitter layer, where they recombine to emit light. Typically, the anode and cathode of an OLED have an energy difference of about 1.6–1.8 eV. A typical band gap of emitter layer material is about 2.0 eV-3.2 eV, so that radiation emission resulting from recombination is in the visible light region (1.75 to 3 eV). In the multilayer embodiments of the present invention, the increase in energy difference of holes and electrons from the anode and cathode to the emitter layer is accomplished incrementally as the electrons and holes travel through the layers between the electrodes and the emitter layer. The energy difference is increased in increments of about 0.2–0.3 eV per layer to achieve the resulting band gap of 2.7 eV-2.9 eV in the emitter layer. A staircase change in energy provides for a lower operating voltage and better efficiency of operation of the OLED device, resulting in a higher quantum yield of luminescence for a given current density.

EXAMPLES

The following examples demonstrate that OLEDs of the present invention have anodes with improved work function stability, comparable or higher current density values at a particular voltage, and potentially higher overall luminance levels due to their extended lifetimes when compared to OLEDs having anodes without a stabilizing layer.

Example 1

Comparison of Luminance as a Function of Time for OLEDs Having Different Anode Structures FIG. 9 is a graph of normalized luminance versus time for three OLEDs having three different types of anodes. Graph line 710 shows data from an OLED of the present invention having an unashed multi-layer anode comprising an indium tin oxide first layer and a molybdenum stabilizing layer. Graph line 720 shows data from an OLED of the present invention having an ashed multi-layer anode comprising the same materials. Graph line 730 shows data from an OLED having a single layer anode comprising indium tin oxide without a stabilizing layer. Comparison of luminance versus time for the three OLEDs shows that the luminance of the OLED having a single layer anode without a stabilizing layer 730 falls off more rapidly than the luminance of OLEDs of the present invention 710, 720. Thus, OLEDs of the present invention demonstrate improved stability of the anode.

Example 2

Figure 10:
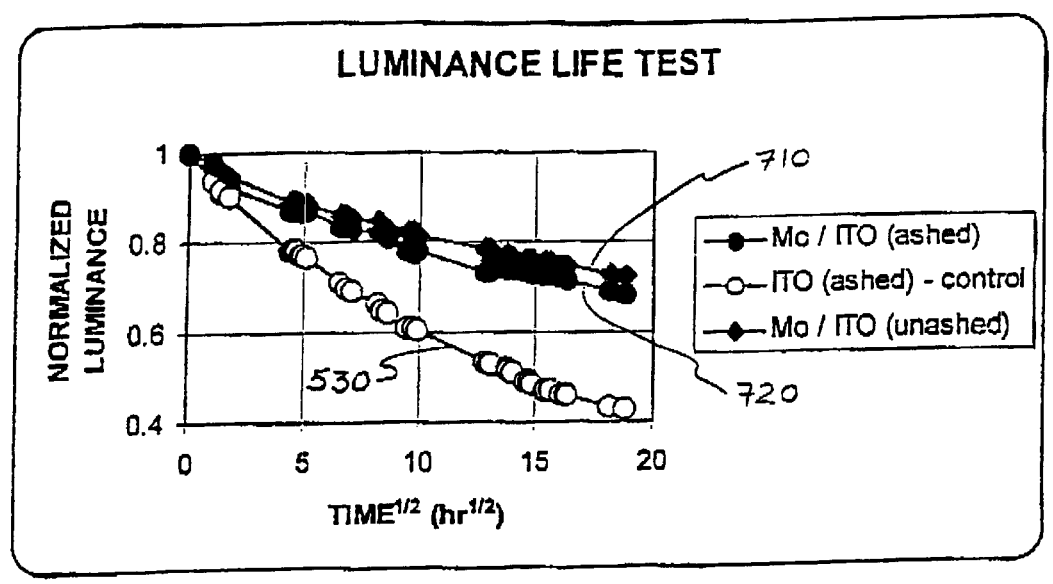
FIG. 10 shows normalized luminance as a function of time for an OLED of the present invention compared to an OLED having a single-layer anode.

Comparison Luminance as a Function of Applied Voltage for OLEDs Having Different Anode Structures FIG. 10 shows current density versus applied voltage for two OLEDs having different anode structures. The filled data points 810 represent current density values obtained at particular voltages from an OLED of the present invention having an anode comprising a first layer of indium tin oxide and a stabilizing layer of molybdenum that is 80 Å thick. The open data points 820 represent current density values obtained at particular voltages from an OLED having an anode comprising a single layer of indium tin oxide without a stabilizing layer. The data show that, for a given voltage, current density values for an OLED of the present invention 810 are comparable to or somewhat better than current density values for an OLED comprising a single layer anode without a stabilizing layer 820.

Example 3

Figure 11:
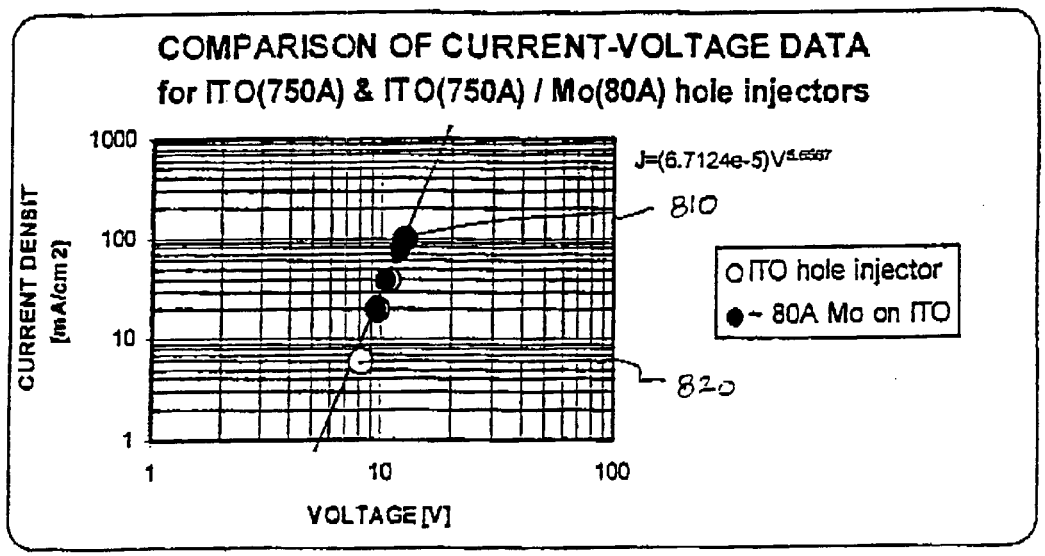
FIG. 11 shows current density as a function of voltage for an OLED of the present invention compared to an OLED having a single-layer anode.
Figure 12:
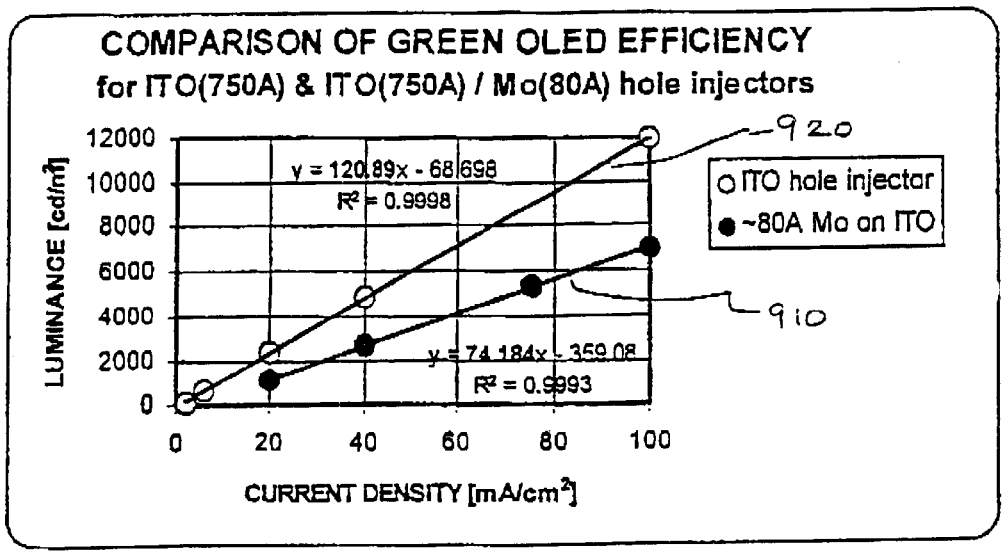
FIG. 12 shows luminance as a function of current density for an OLED of the present invention compared to an OLED having a single-layer anode.

Comparison of Luminance as a Function of Current Density for OLEDs Having Different Anode Structures FIG. 11 shows initial luminance as a function of current density for two OLEDs having different anode structures. The lower line 910 represents data from an OLED of the present invention having a multi-layer anode comprising a first layer of indium tin oxide and a stabilizing layer comprising molybdenum that is 80 Å thick. The upper line 920 represents data from an OLED having an anode comprising a single layer of indium tin oxide without a stabilizing layer.

The OLED of the present invention initially exhibits slightly lower but acceptable levels of luminance compared to the OLED having a single layer anode without a stabilizing layer. However, because an OLED of the present invention has an extended lifetime, the device may ultimately provide a higher luminance level than an OLED having a single layer anode without a stabilizing layer.

References Cited

All references cited herein are incorporated herein by reference in their entirety and for all purposes to the same extent as if each individual publication or patent or patent application were specifically and individually indicated to be incorporated by reference in its entirety for all purposes as fully set forth.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

What is claimed is:

1. An organic light-emitting diode device that emits white or blue light, comprising.
   (a) a bottom electrode that is an anode comprising a first layer comprising indium tin oxide and a second layer that is a stabilizing layer comprising molybdenum, wherein the area of said stabilizing layer is substantially equal to the area of the first layer;
   (b) a hole-injection layer adjacent to said stabilizing layer comprising CuPc;
   (c) a hole-transport layer adjacent to said hole-injection layer comprising NPD;
   (d) an emitter layer adjacent to said hole-transport layer comprising DCJTB, IDE-120 and IDE-102;
   (e) an electron-transport layer adjacent to said emitter layer comprising ALQ; and
   (f) a top electrode that is a cathode comprising aluminum and lithium fluoride.

2. An organic light-emitting diode device that emits white or blue light, comprising:
   (a) a bottom electrode that is an anode comprising molybdenum;
   (b) a hole-injection layer adjacent to said anode comprising CuPc;
   (c) a hole-transport layer adjacent to said hole-injection layer comprising NPD;
   (d) an emitter layer adjacent to said hole-transport layer comprising DCJTB, IDE-120 and IDE-102;
   (e) an electron-transport layer adjacent to said emitter layer comprising ALQ; and
   (f) a top electrode that is a cathode comprising aluminum and lithium fluoride.

3. An organic light-emitting diode device that emits white or blue light, comprising:
   (a) a bottom electrode that is an anode comprising a compound selected from the group consisting of Niobium (Nb), zirconium (Zr), cobalt (Co), zinc (Zn), technetium (Tn), hafnium (Hf), tantalum (Ta), chromium (Cr), gold (Au), platinum (Pt), palladium (Pd), selenium (Sc), nickel (Ni), tungsten (W), alloys of one or more of these metals, oxides of one or more of these metals and nitrides of one or more of these metals;

(b) a hole-injection layer adjacent to said anode comprising CuPc;

(c) a hole-transport layer adjacent to said hole-injection layer comprising NPD;

(d) an emitter layer adjacent to said hole-transport layer comprising DCJTB, IDE-120 and IDE-102;

(e) an electron-transport layer adjacent to said emitter layer comprising ALQ; and (f) a top electrode that is a cathode comprising aluminum and lithium fluoride.

* * * * *